(12) United States Patent
Li et al.

(10) Patent No.: US 12,358,729 B2
(45) Date of Patent: Jul. 15, 2025

(54) AUTOMATED MATERIAL HANDLING SYSTEM (AMHS) RAIL METHODOLOGY

(71) Applicant: Taiwan Semiconductor Manufacturing Company, Ltd., Hsinchu (TW)

(72) Inventors: Guancyun Li, Toufen Town (TW); Ching-Jung Chang, Taichung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 859 days.

(21) Appl. No.: 17/484,973

(22) Filed: Sep. 24, 2021

(65) Prior Publication Data

US 2022/0348415 A1 Nov. 3, 2022

Related U.S. Application Data

(60) Provisional application No. 63/182,201, filed on Apr. 30, 2021.

(51) Int. Cl.
 *B65G 43/10* (2006.01)
 *B65G 17/12* (2006.01)
 (Continued)

(52) U.S. Cl.
 CPC ............ *B65G 43/10* (2013.01); *B65G 17/12* (2013.01); *B65G 49/07* (2013.01);
 (Continued)

(58) Field of Classification Search
 CPC ........ B65G 43/10; B65G 17/12; B65G 49/07; B65G 47/648; H01L 21/67715; H01L 21/67727; H01L 21/67733
 See application file for complete search history.

(56) References Cited

U.S. PATENT DOCUMENTS

| 6,991,720 B2 * | 1/2006 | Caze ..................... B01J 35/60 208/213 |
| 10,742,969 B1 * | 8/2020 | Rohatgi ............... H04N 17/002 |

(Continued)

FOREIGN PATENT DOCUMENTS

| CN | 106218673 A | 12/2016 |
| CN | 106540452 A | 3/2017 |

(Continued)

OTHER PUBLICATIONS

JP 2002299421 merged original patent publication and translation (Year: 2002).*

(Continued)

*Primary Examiner* — Thomas Randazzo
*Assistant Examiner* — Laurence R Brothers
(74) *Attorney, Agent, or Firm* — Lippes Mathias LLP

(57) ABSTRACT

A system and method for rail management of an overhead transport ("OHT") system of an associated automated material handing system ("AMHS") that includes a controller in communication with the OHT system, including vehicles traveling on rails of the OHT. The rail management system also includes a turntable located on a portion of the OHT and equipped with a set of fixed rails. Upon receipt of a request to rotate the turntable from a first run-through direction to a second run-through direction, the controller engages at least one stopper sensor located near the turntable. The controller then directs the turntable to rotate from the first run-through direction to the second run-through direction. After completion, the controller disengages the at least one stopper to enable vehicles to travel directly in the second run-through direction.

20 Claims, 8 Drawing Sheets

(51) Int. Cl.
*B65G 47/64* (2006.01)
*B65G 49/07* (2006.01)
*H01L 21/677* (2006.01)

(52) U.S. Cl.
CPC .. *H01L 21/67715* (2013.01); *H01L 21/67727* (2013.01); *H01L 21/67733* (2013.01); *B65G 47/648* (2013.01)

(56) References Cited

U.S. PATENT DOCUMENTS

| | | | |
|---|---|---|---|
| 2004/0181929 | A1 | 9/2004 | Mariano et al. |
| 2007/0205081 | A1 | 9/2007 | Kyutoku et al. |
| 2011/0245964 | A1* | 10/2011 | Sullivan ............ H01L 21/68707 700/228 |

FOREIGN PATENT DOCUMENTS

| | | | |
|---|---|---|---|
| CN | 110867395 | A | 3/2020 |
| CN | 111217150 | A | 6/2020 |
| JP | 2002299421 | A * | 10/2002 |
| JP | 2004142491 | A | 5/2004 |
| JP | 2005144606 | A * | 6/2005 |
| JP | 2007141019 | A * | 6/2007 |
| JP | 2008197705 | A | 8/2008 |
| JP | 2009242084 | A * | 10/2009 |
| KR | 2019023540 | A * | 3/2019 ......... B60H 1/00792 |
| KR | 20190023540 | A * | 3/2019 |
| TW | 498045 | B | 8/2002 |

OTHER PUBLICATIONS

JP 2007141019 merged original patent publication and translation (Year: 2007).*
KR 20190023540 merged original patent publication and translation (Year: 2019).*
JP-2005144606-A (Year: 2005).*
JP-2009242084-A (Year: 2009).*
JP-2007141019-A (Year: 2007).*
KR-20190023540-A (Year: 2019).*
Chinese Office Action for Application No. 202210043495.0 Dated Jan. 2, 2025.
Chinese Notice of Allowance for Application No. 202210043495.0, Dated May 30, 2025.

* cited by examiner

AUTOMATED MATERIAL HANDLING SYSTEM (AMHS) RAIL METHODOLOGY

PRIORITY CLAIM AND CROSS-REFERENCE

This application claims the benefit of U.S. Provisional Application Ser. No. 63/182,201 filed Apr. 30, 2021 and titled DESIGN FOR AN AUTOMATED MATERIAL HANDLING SYSTEM (AMHS) RAIL METHODOLOGY. U.S. Provisional U.S. Provisional Application Ser. No. 63/182, 201 filed Apr. 30, 2021 and titled DESIGN FOR AN AUTOMATED MATERIAL HANDLING SYSTEM (AMHS) RAIL METHODOLOGY is incorporated herein by reference in its entirety.

BACKGROUND

The following relates to automated material handling systems, manufacturing execution systems, and overhead transportation systems. The manufacture of semiconductor devices involves the performance of a series of process steps using a variety of high tech production and metrology tools in a certain order and often within a certain period of time. The primary function of a wafer logistics system in a wafer fabrication facility, or "fab," is to deliver the wafers to each of the tools at the right time, as well as to track the location and status of the wafers throughout the process. Automated material handling systems ("AMHS") and/or manufacturing execution systems ("MES") are applied to wafer fabs to carry out the automated functions more efficiently, consistently, and safely than can be done via manual means. The fabrication process often results in the need for movement of wafers to different processing stations within the fab using overhead transportation ("OHT"). Traffic on the OHT may occur as wafer carrier vehicles move along the rails of the OHT, particularly during rail cross over locations.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
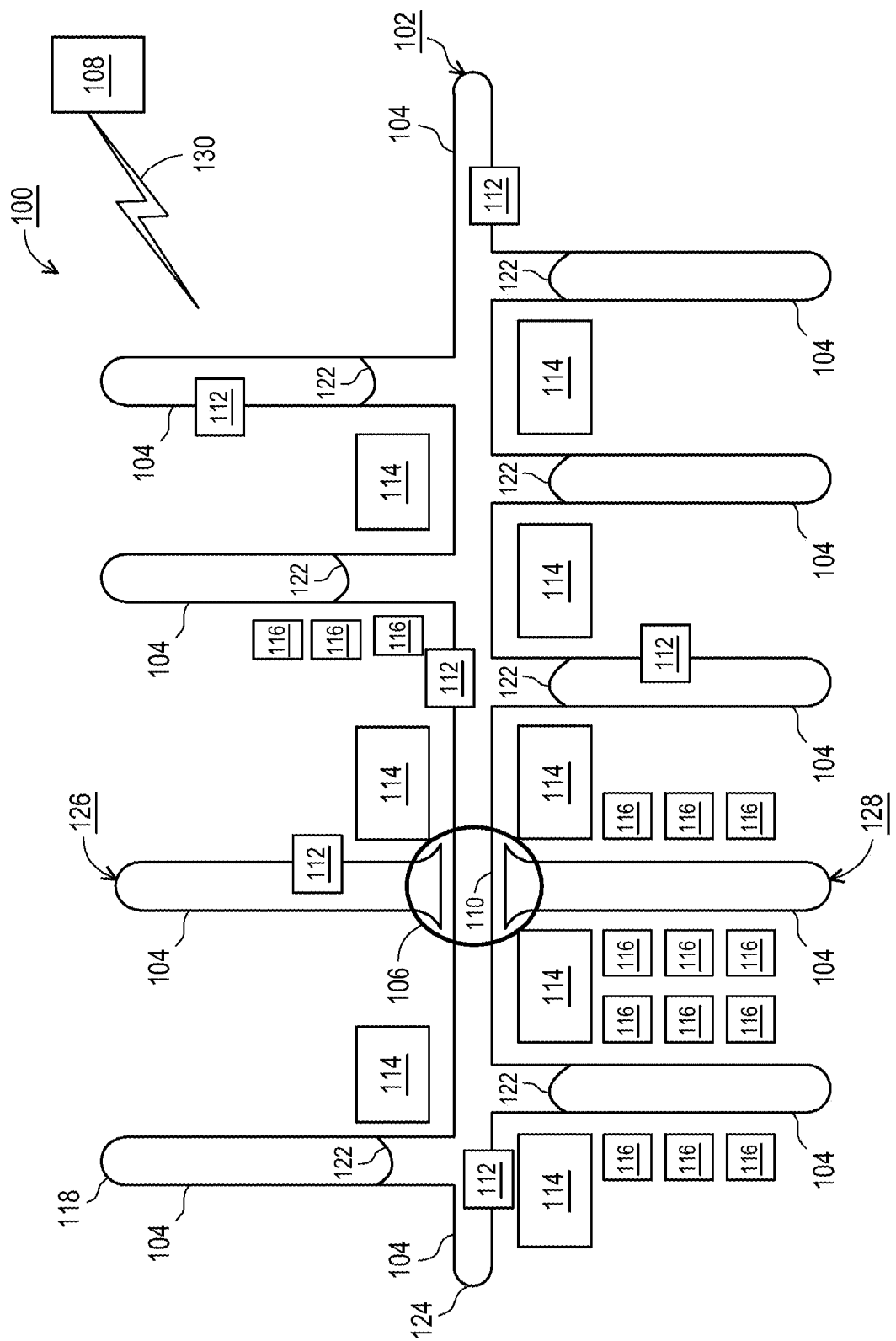
FIG. 1 is a block diagram illustrative of an AMHS and OHT in accordance with some embodiments of the subject application.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A semiconductor foundry may include a plurality of fabs. During processing, a lot may be transferred between the plurality of fabs for different steps of the manufacturing process. A "cross-fab transfer" involves the transfer of a lot, e.g., a wafer carrier, a group of wafer carriers, etc., from one fab to another. It should be noted that the different fabs are different insofar as they may occupy different physical spaces (e.g., different buildings or different floors or suites within a same building), and/or may constitute self-contained sub-processing lines. In general, the different fabs may reside in the same building, or in different buildings. A "cross-AMHS transfer" involves the transfer of a lot from one AMHS to another AMHS, regardless of whether the AMHSs are separate systems within a single fab or systems in separate fabs. Each fab may include multiple phases and/or multiple floors. In that regard, in some embodiments the fab may be what is referred to as a "Gigafab." A "cross-phase transfer job" involves the transfer of a lot from one phase to another.

Each phase of a fab includes a plurality of bays that may include processing tools or equipment. The equipment within each bay may be interconnected by an intrabay overhead transport ("OHT") system. The bays may be interconnected with the other bays via an interbay OHT system. As will be familiar to those of ordinary skill in the relevant art, the intrabay OHT systems and the interbay OHT system comprise overhead tracks or rails on which OHT vehicles transport wafer carriers containing lots of wafers to be processed to and from the equipment of the bays, often via stockers. In addition to or in lieu of the OHT systems, each fab may include an intrabay and/or interbay overhead shuttle ("OHS") system. Each fab may also include a cross-floor transportation system. The cross-floor transportation system may include lifters and/or other mechanisms for implementing cross-floor transfers of wafer carriers.

Referring now to FIG. 1, there is shown a schematic diagram illustrating a portion of an AMHS system 100 in accordance with one embodiment of the subject application. As depicted in FIG. 1, the AMHS system 100 includes an overhead transportation (OHT) system 102, which may include, for example and without limitation, automated vehicles, personnel guided vehicles, rail guided vehicles, overhead shuttles, overhead hoist transports, and the liked. As used herein, vehicles 112 may include any of the foregoing when referenced in FIG. 1 with respect to the OHT 102. The OHT 102 of the AMHS system 100 includes a plurality of tracks or rails 104 positioned throughout a fabrication location. These fixed rails 104 may also utilize one or more cross-over rail segments 122, positioned between parallel portions of the rails 104 to enable vehicles 112 to transit between such segments and alter direction of travel accordingly. As illustrated in FIG. 1, the OHT 102 includes various rail sections, denoted as a main rail section 124 running the length of the OHT 102, and one or more perpendicular sections 126, 128 that extend off of the main rail section 124 to enable use of additional processing tools 116. The vehicles 112 are suitably configured to move along the rails 104 of the OHT 102 in accordance with instructions, commands, preprogramming, etc., provided by the AMHS/OHT controller 108, as discussed in greater detail below.

As shown in FIG. 1, the AMHS system 100 further includes one or more wafer stockers 114, that are operable to receive and stage wafer carriers for processing by one or more wafer processing or fabrication devices, denoted generally as the processing tools 116 of FIG. 1. The processing tools 116 may include, for example and without limitation, dry or wet etching chambers, CVD chambers, SACVD tools, cleaning chambers, EUV chambers, or other semiconductor manufacturing tools, as will be understood by those skilled in the art. In varying embodiments, the processing tools 116 and wafer stockers 114 are positioned adjacent or proximate to a rail 104 of the OHT 102 to enable a vehicle 112 to transport a wafer carrier to or from such tool 116 or stocker 114. The AMHS system 100 further includes a remediation section 118 of the OHT 102 having a portion of the rails 104 positioned to receive damaged vehicles 112 or those vehicles 112 requiring maintenance. It will be appreciated that such a section 118 enables movement of vehicles 112 out of the general flow of traffic along the rails 104 of the OHT 102, thereby providing a safe and remote location for maintenance and/or repair while the remaining vehicles 112 on the OHT 102 may continue their respective operations in the AMHS system 100.

The wafer stockers 114, as will be appreciated by those skilled in the art, may include internal bins for temporarily staging and storing multiple wafer carriers in preparation for transport to a process tool 116. Thus, the wafer stockers 114 may provide a wafer carrier holdover area. As the skilled artisan will appreciate, the wafer stockers 114 may include a port for loading and unloading wafer carriers from the wafer stockers 114. Further, the wafer stockers 114 may include automated components, e.g. robotic arms, that are configured to grasp, raise, lower, store, and/or retrieve a wafer carrier from the stocker 114.

The OHT 102 of the AMHS system 100 further includes at least one turntable 106, positioned at an intersection of rails 104. The turntable 106 includes a section of fixed rails 110 that are configured to align with either set of parallel rails 104 located at the intersection in accordance with the rotation of the turntable 106. FIGS. 2A-3C provide additional views of the turntable 106 in accordance with varying embodiments of the subject application.

Figure 2A:
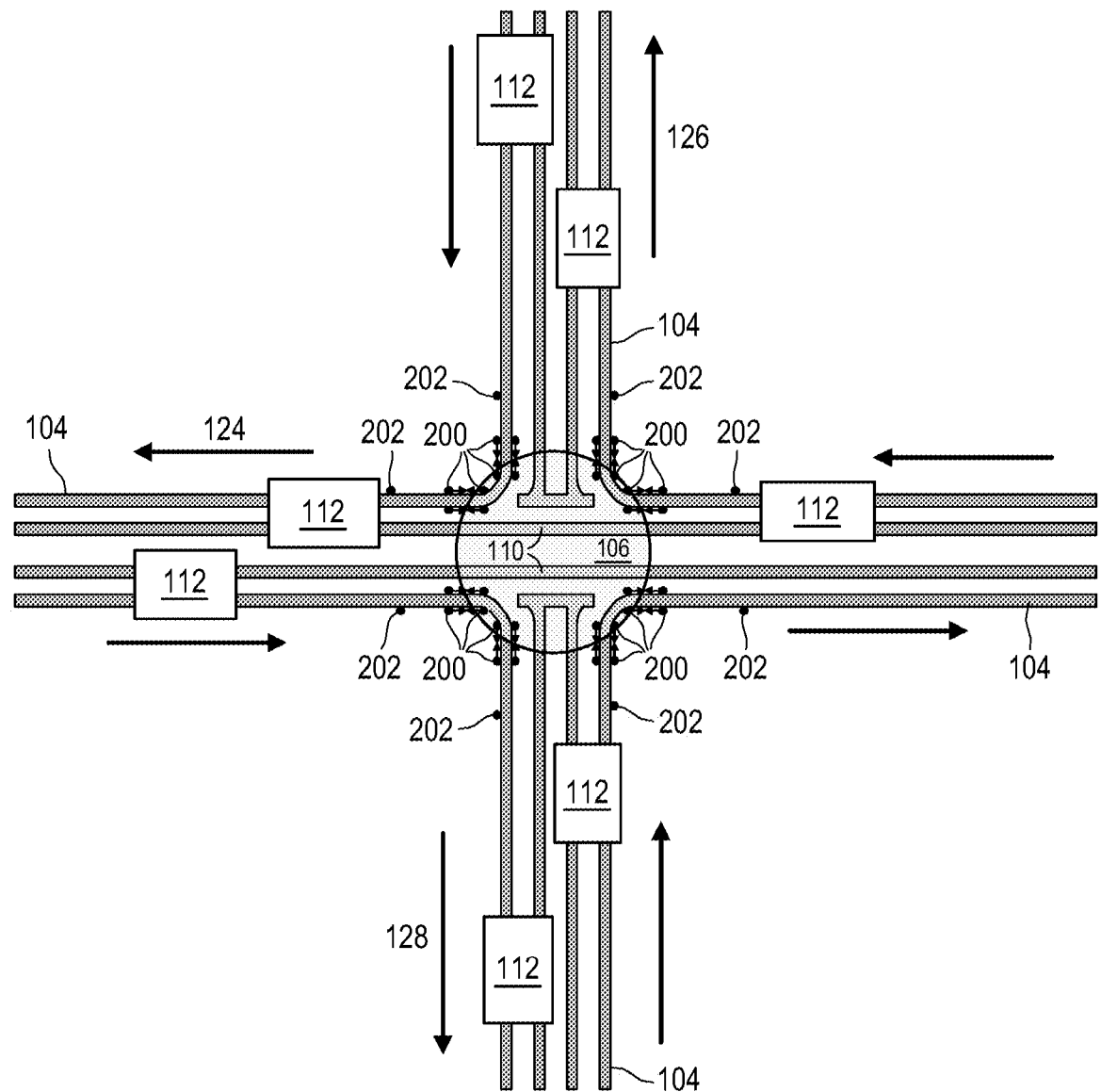
FIG. 2A illustrates a turntable in a first run-through direction used in the AMHS/OHT system in accordance with some embodiments of the subject application.

Referring now to FIG. 2A, there is shown the turntable 106 in a first run-through direction corresponding to the position illustrated in FIG. 1, enabling direct transit of a vehicle 112 along the main rail section 124. In this position, the fixed rail segments 110 are aligned with the rails 104 of the main rail section 124. To ensure alignment, a plurality of alignment sensors 200 are utilized by the AMHS/OHT controller 108 for positioning of the turntable 106 prior to enabling transit of vehicles 112 over the turntable 106. As shown the example embodiment depicted in FIG. 2A, pairs of alignment sensors 200 are positioned on the outer components of the turntable fixed rails 110 and the OHT rails 104.

The alignment sensors 200 utilized in accordance with some embodiments of the subject application may have smaller form factors so as not to overly encumber the rails 104 of the OHT 102 and/or the rails 110 of the turntable 110 and/or obstruct transit of vehicles 112 along the rails 104, 110. In some embodiments, the alignment sensors 200 may be implemented as pairs of optical sensors to ensure proper alignment of the fixed rails 110 with the rails 104 of the main rail section 124. It will be appreciated that other types of alignment sensors may be used herein, including, for example and without limitation, electro-mechanical sensors (e.g. limit switches), image sensors (e.g. charge coupled device (CCD) image sensors and complementary metal-oxide-semiconductor (CMOS) image sensors), or the like. Misalignment of these sensors 200 may be detected by the controller 108 to prevent transit of vehicles 112 that may cause damage to the vehicles 112, the wafer carriers, personnel below the OHT 102, and the like, as discussed in greater detail below.

FIG. 2A further illustrates stopper sensors 202 positioned on the rails 104 of the main rail segment 124, as well as on the rails 104 of the first perpendicular rail segment 126 and the second perpendicular rail segment 128. The stopper sensors 202 may be implemented as electromechanical, electro-optical, proximity, or other type of sensors. In some embodiments, optical or image sensors are used to detect vehicles 112 for brake activation prior to transiting the turntable 106 or if running/moving in a direction perpendicular to the turntable rails 110, to stop a suitable distance from the turntable 106 on the rails 114 of the first perpendicular section 126 or the second perpendicular section 128. In varying embodiments a suitable distance may be in the range, for example and without limitation, 1 to 3 meters from the turntable 106 to avoid any creation of congestion upon reactivation, allow a suitable safety distance for stopping the vehicle 112, and prevent any damage to the vehicle 112 during rotation of the turntable 106. Rotation of the turntable 106 may be accomplished via, for example and without limitation, step motors, servo motors, gear driven motors, hydraulic control, magnetic manipulation, pneumatic manipulation, or any suitable combination thereof. It will be appreciated that the size of the turntable 106 may be dependent upon the distance between rails 104 of the OHT, the size of the rails 104 on the OHT 102, the distance between cross-over rails 122, and the like It will be appreciated by those skilled in the art that the OHT 102 and AMHS system 100 may utilize a plurality of other types of sensors (not shown) to collect data associated with the operations of the OHT 102 and/or the AMHS system 100. Such sensors may include sensors utilized to identify a passing vehicle 112 (e.g., a radio frequency identification (RFID) sensor) and other sensors utilized to characterize the performance of the passing vehicle 112 (e.g., a sound sensor, vibration sensor, or image sensor). As another example, different sensors may be utilized to monitor performance of a passing vehicle in conjunction with other vehicles 112 on the OHT 102, such as proximity sensors that determine a time for vehicle passing from one point to another and a sound sensor to characterize sounds or vibrations generated from the passing vehicle. This sensor data may be compared to better characterize the performance of the vehicle over a time period and in cross referencing for increased sensory accuracy. Furthermore, by cross referencing sensor data, sensor abnormalities may also be detected and remediated (e.g., fixed or replaced) at or before the point of sensor failure.

Figure 2B:
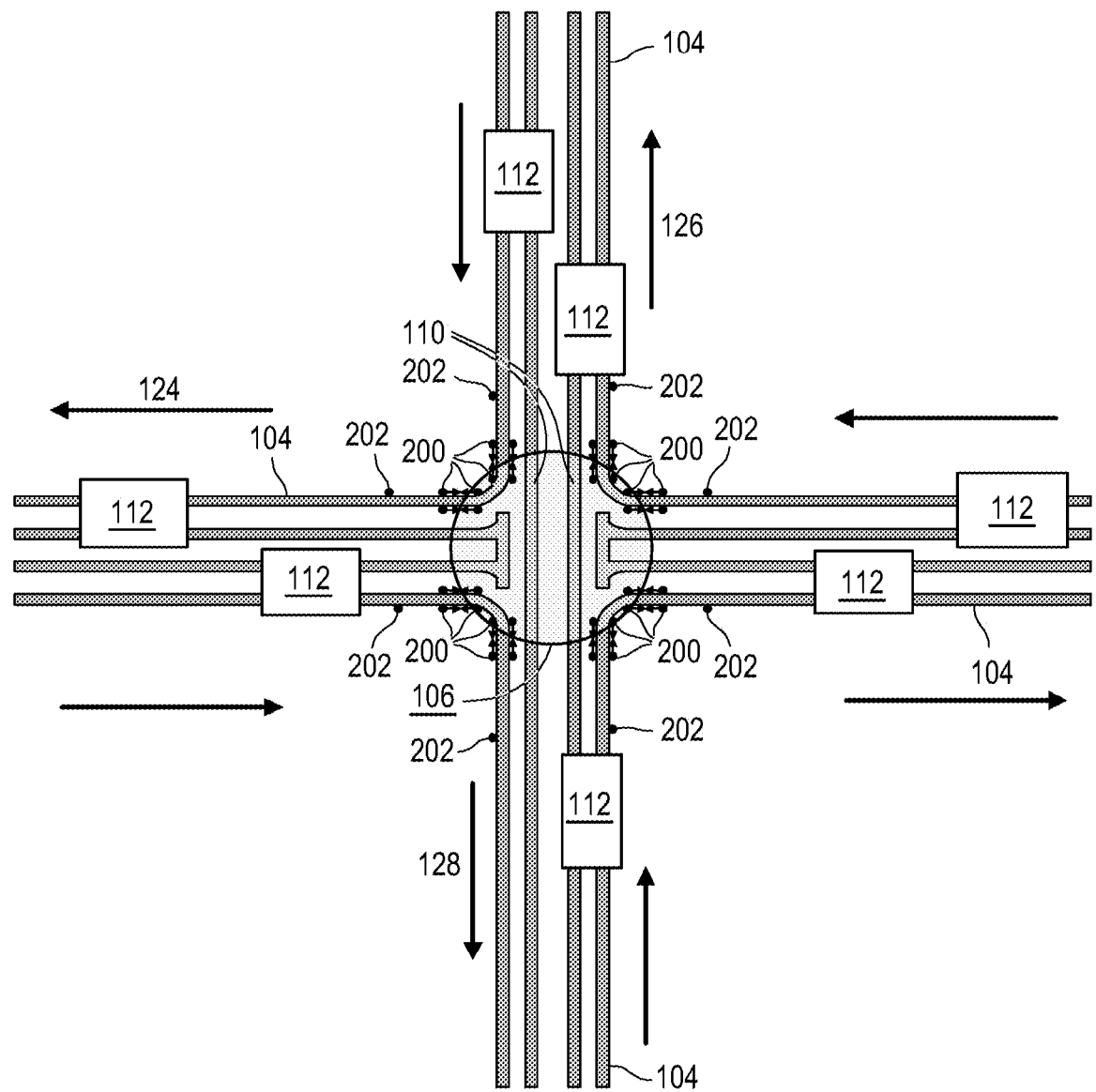
FIG. 2B illustrates a turntable in a second run-through direction used in the AMHS/OHT system in accordance with some embodiments of the subject application.

In FIG. 2B, the turntable 106 has rotated from the first run-through direction to a second run-through direction, i.e., a vehicle 112 may now transit from a first perpendicular rail section 126 directly to a second perpendicular rail section 128, thereby bisecting the main rail section 124 of the OHT. In FIG. 2B, the second run-through direction is illustrated as perpendicular to the main rail section 124, enabling vehicles 112 to move directly from the first rail section 126 to the second rail section 128. As shown, the fixed rails 110 on the turntable 106 are aligned in the second run-through direction with the rails 104 of the first perpendicular section 126 and the second perpendicular section 128 of the OHT 102. As discussed above with respect to FIG. 2A, the turntable 106 illustrated in FIG. 2B utilizes the alignment sensors 200 and the stopper sensors 202 in a similar manner. In FIG. 2B, however, vehicles 112 transiting on the main rail section 124 are directed to activate their respective brakes in accordance with an output of the stopper sensors 202, thereby allowing transit of vehicles directly to and from the first perpendicular section 126 and the second perpendicular section 128.

Figure 3A:
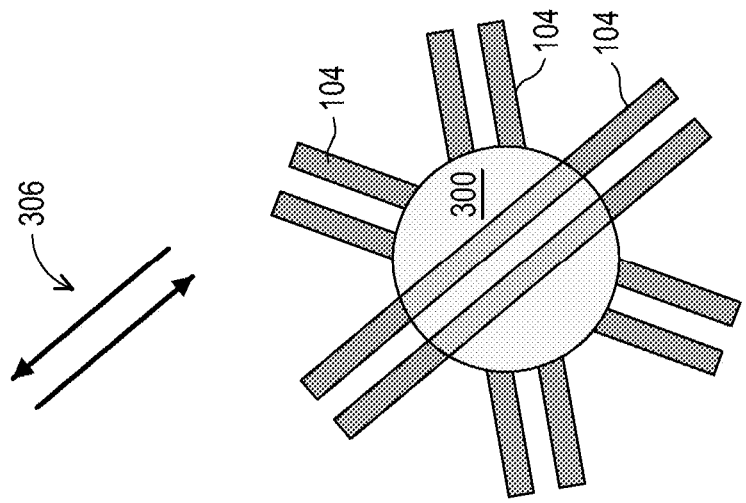
FIG. 3A illustrates a turntable in a first run-through direction used in the AMHS/OHT system in accordance with some embodiments of the subject application.
Figure 3B:
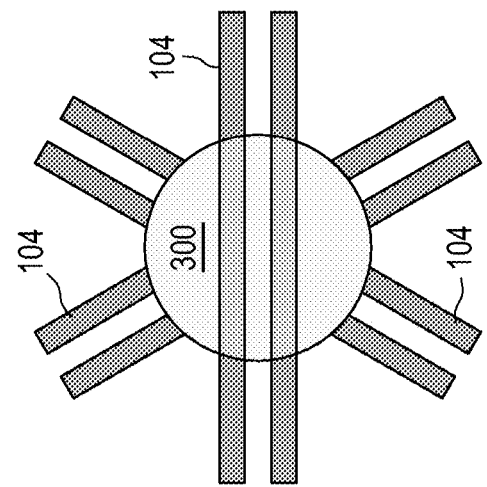
FIG. 3B illustrates a turntable in a second run-through direction used in the AMHS/OHT system in accordance with some embodiments of the subject application.
Figure 3C:
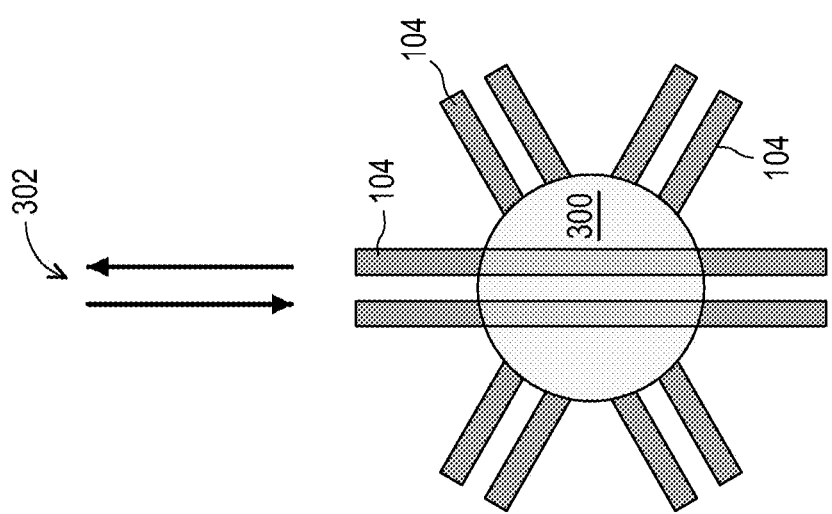
FIG. 3C illustrates a turntable in a third run-through direction used in the AMHS/OHT system in accordance with some embodiments of the subject application.

Turning now to FIGS. 3A, 3B, and 3C, there is shown another embodiment of a turntable 300 in accordance with the systems and methods set forth herein. In particular, FIGS. 3A-3C depict the turntable 300 implemented on an intersection of three sets of rails 104, illustrating a first run-through direction 302, a second run-through direction 304, and a third run-through direction 306. It will be appreciated by those skilled in the art that the depiction of three run-through directions 302-306 is intended solely as an example, and additional run-through directions, e.g., 2, 3, 4, 5, 6, etc., are also capable of being implemented in accordance with varying embodiments of the subject application. That is, depending upon the size of the AMHS system 100 and the OHT 102, the turntable 300 may be placed at an intersection of multiple run-through directions, enabling traffic management of vehicles 112 therethrough.

In FIG. 3A, the turntable 300 is illustrated as allowing passage of vehicles 112 in the first run-through direction 302, i.e., a zero degree turn (original orientation). FIG. 3B illustrates the turntable rotated ninety-degrees, allowing passage of vehicles 112 in the second run-through direction 304, and FIG. 3C illustrates the turntable rotated forty-five degrees to allow passage of vehicles 112 in the third run through direction 306. Variations of the rotation of the turntable 300 depending upon orientation of the rails 104 of the run-through directions 302, 304, and 306, may be illustrated with 0° for the first run-through 302, 60° for the second run-through 304, and 180° for the third run-through 306. It will be understood by the skilled artisan that the angle of rotation of the turntable 300 may be dictated not only by the location of the various run-throughs 302-306, but also the number of run-throughs, the size of the turntable, the size of the rails 104, and the like.

The skilled artisan will appreciate that the turntable 300 illustrated in FIGS. 3A-3C may utilize similar sensors 200, 202 as set forth above in FIGS. 2A-2B. In such an embodiment, alignment sensors 200 and stopper sensors 202 may be position on each of the rails 104 of the run-throughs 302-306. Accordingly, while not illustrated in FIGS. 3A-3C, the skilled artisan will appreciate that the placement and function of such sensors 200, 202 in FIGS. 3A-3C may mirror that of FIGS. 2A-2B.

Returning to FIG. 1, the AMHS system 100 further includes an AMHS/OHT controller 108 in communication via a communications link 130 with the turntable 106, the vehicles 112, the various sensors 200-202, the stockers 114, process tools 116, and myriad other devices (not shown) coupled to or forming a part of the AMHS system and/or the OHT 102. It will be appreciated by those skilled in the art that while shown as a single device, the AMHS/OHT controller 108 may be implemented in a distributed manner, wherein a plurality of electronic data processing devices collaborate to perform the functions described herein. The communications link 130 illustrated in FIG. 1 may be any suitable means of wired or wireless communication, including, for example and without limitation, the public switched telephone network, a proprietary communications network, infrared, optical, or other suitable wired or wireless data communications. In some embodiments, the various components of the AMHS system 100 are in communication with a distributed computing environment, e.g. a local area network, a wireless local area network, a virtual private network, a wide area network, or the like. The functioning and controls provided by the AMHS/OHT controller 108 in accordance with the various embodiments discussed herein will be better understood in conjunction with FIG. 4.

Figure 4:
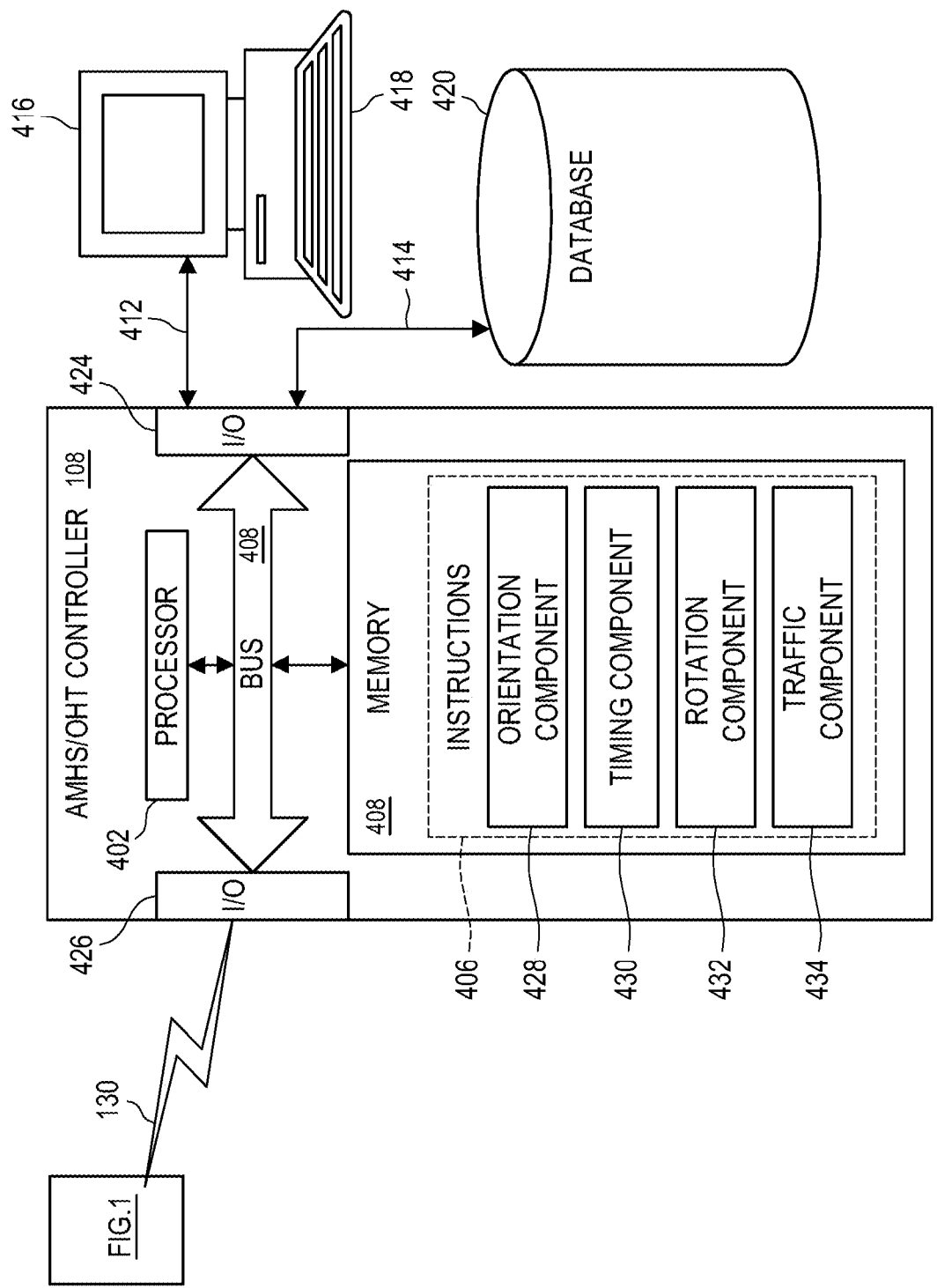
FIG. 4 illustrates a block diagram of an AMHS/OHT controller in accordance with some embodiments of the subject application.

Turning now to FIG. 4, there is shown an illustrative block diagram of a suitable AMHS/OHT controller 108 in accordance with one embodiment of the subject application. The various components of the AMHS/OHT controller 108 may be connected by a data/control bus 408. The processor 402 of the AMHS/OHT controller 108 is in communication with an associated database 420 via a link 414. A suitable communications link 414 may include, for example, the public switched telephone network, a proprietary communications network, infrared, optical, or other suitable wired or wireless data communications. The database 420 is capable of implementation on components of the AMHS/OHT controller 108, e.g., stored in local memory 404, i.e., on hard drives, virtual drives, or the like, or on remote memory accessible to the AMHS/OHT controller 108.

The associated database 420 is representative of any organized collections of data (e.g., lot information, traffic flow information, process tool information, vehicle status information, fabrication information, material information, one or more lookup tables, translation information, etc.) used for one or more purposes. The skilled artisan will appreciate that such information may be updated via machine learning during operations of the subject AHMS system 100. Implementation of the associated database 420 is capable of occurring on any mass storage device(s), for example, magnetic storage drives, a hard disk drive, optical storage devices, flash memory devices, or a suitable combination thereof. The associated database 420 may be implemented as a component of the AMHS/OHT controller 108, e.g., resident in memory 404, or the like. In one embodiment, the associated database 420 may include data corresponding to production scheduling, OHT information, vehicle information (e.g. speed, position, status, etc.), lot information, priority information, and the like.

The AMHS/OHT controller 108 may include one or more input/output (I/O) interface devices 422 and 424 for communicating with external devices. The I/O interface 424 may communicate, via communications link 412, with one or more of a display device 416, for displaying information, such estimated destinations, and a user input device 418, such as a keyboard or touch or writable screen, for inputting text, and/or a cursor control device, such as mouse, trackball, or the like, for communicating user input information and command selections to the processor 402. The I/O interface 422 may communicate with external devices such as the vehicles 112, the turntable 106, the stockers 114, the process tools 116, the alignment sensors 200, the stopper sensors 202, via the communications link 130.

It will be appreciated that the AMHS/OHT controller 108 illustrated in FIG. 4 is capable of implementation using a distributed computing environment, such as a computer network, which is representative of any distributed communications system capable of enabling the exchange of data between two or more electronic devices. It will be further appreciated that such a computer network includes, for example and without limitation, a virtual local area network, a wide area network, a personal area network, a local area network, the Internet, an intranet, or any suitable combination thereof. Accordingly, such a computer network comprises physical layers and transport layers, as illustrated by various conventional data transport mechanisms, such as, for example and without limitation, Token-Ring, Ethernet, or other wireless or wire-based data communication mechanisms. Furthermore, while depicted in FIG. 4 as a networked set of components, the AMHS/OHT controller 108 is capable of implementation on a stand-alone device adapted to interact with the AMHS system 100 and/or the OHT 102 described herein.

The AMHS/OHT controller 108 may include one or more of a computer server, workstation, personal computer, cellular telephone, tablet computer, pager, combination thereof, or other computing device capable of executing instructions for performing the exemplary method.

According to one example embodiment, the AMHS/OHT controller 108 includes hardware, software, and/or any suitable combination thereof, configured to interact with an associated user, a networked device, networked storage, remote devices, or the like.

The memory 404 illustrated in FIG. 4 as a component of the AMHS/OHT controller 108 may represent any type of non-transitory computer readable medium such as random access memory (RAM), read only memory (ROM), magnetic disk or tape, optical disk, flash memory, or holographic memory. In one embodiment, the memory 404 comprises a combination of random access memory and read only memory. In some embodiments, the processor 402 and memory 404 may be combined in a single chip. The network interface(s) 422, 424 allow the computer to communicate with other devices via a computer network, and may comprise a modulator/demodulator (MODEM). Memory 404 may store data processed in the method as well as the instructions for performing the exemplary method.

The digital processor 402 can be variously embodied, such as by a single core processor, a dual core processor (or more generally by a multiple core processor), a digital processor and cooperating math coprocessor, a digital controller, or the like. The digital processor 402, in addition to controlling the operation of the AMHS/OHT controller 108, executes instructions 406 stored in memory 404 for performing the method set forth hereinafter.

As shown in FIG. 4, the instructions 406 stored in memory 404 may include a sensor component 426 configured to receive an output from one or more sensors, e.g. alignment sensors 200 and/or stopper sensors 202 from the OHT 102. In some embodiments, the sensor component 426 is configured to determine from the received output whether each pair of alignment sensors 200 are correctly aligned, thereby indicating that the turntable 106 is properly positioned to allow vehicles 112 to transit across the rails 110 of the turntable 106. When the output from the alignment sensors 200 indicate that one or more sensors 200 are misaligned, the sensor component 426 may generate feedback to the processor 402 to further rotate the turntable 106, to activate the stopper sensors 202 thereby halting movement of vehicles 112 at or near the turntable 106, generate an alert/alarm indicating a misalignment, or the like. The sensor component 426 may further be configured to receive an output from the stopper sensors 202, indicative of a stoppage of vehicles 112 on approach to the turntable 106.

The instructions 406 stored in the memory 404 of the AMHS/OHT controller 108 may further include an orientation component 428 configured to determine a current orientation of the turntable 106 with respect to the rails 104 of the OHT 102. That is, the orientation component 428 may be configured to sense, via communication with the sensor component 426, the current position of the rails 110 of the turntable 106 in a first run-through direction (FIG. 2A) or a second run-through direction (FIG. 2B).

The memory 404 of the AMHS/OHT controller 108 may further store a timing component 430 in the instructions 406 configured to set and determine appropriate timing sequences for activation of brakes on a vehicle 112 in accordance with the stopper sensors 202, setup times for when to begin rotation of the turntable 106 in accordance with a determined run-through direction, and the like. In some embodiments, the timing component 430 may be configured to receive output from the sensor component 428 relative to an amount of time required for a vehicle 112 to stop, move through the turntable 106, and the like. The skilled artisan will appreciate that other timing aspects with respect to operations of the AMHS system 100 and OHT 102 may also be collected, processed, and utilized via the timing component 430 in accordance with other embodiments contemplated herein.

The memory 404 further stores instructions 406 that include a rotation component 432 operable to control rotation of the turntable 106 in accordance with a required run-through direction. In varying embodiments, the rotation component 432 may utilize preprogrammed sequences of rotations, rotating the turntable on a schedule determined by the production of the AMHS system 100, availability of process tools 116, number of vehicles 112 available or in operation on the OHT 102, and the like. Such rotation sequences may be stored in the associated database 420 and recalled in accordance with an output of the timing component, sensor component, and the like. In some embodiments, the rotation component 432 operations in conjunction with the orientation component 428 to ensure that the proper rotation of the turntable 106, e.g., 0°, 30°, 45°, 60°, 90°, 180°, 270°, etc., and the direction of such rotation, e.g., clockwise, counterclockwise, is performed in accordance with the needs of the AMHS system 100.

The instructions 406 stored in memory 404 further include a traffic component 434 configured to monitor traffic, i.e. movement and congestion of vehicles 112 on the OHT 102, position of vehicles 112, speed, and the like. In some embodiments, the traffic component is in communication with the sensor component 426 to receive an output therefrom relating to vehicle 112 passage and location. The traffic component 434 may also be in communication with the orientation component 428 to receive an output therefrom indicative of the orientation of the turntable 106, i.e. the run-through direction in which the turntable 106 is currently oriented. Additionally, the traffic component 434 may be in communication with the rotation timing component 430 and the rotation component 432 to receive timing information and send rotation information therebetween. In varying embodiments contemplated herein, the traffic component 434 may utilize machine learning to identify appropriate times during production and vehicle movement to effectuate rotation of the turntable 106 to reduce vehicle congestion and/or improve production of the AMHS system 100.

The term "software," as used herein, is intended to encompass any collection or set of instructions executable by a computer or other digital system so as to configure the computer or other digital system to perform the task that is the intent of the software. The term "software" as used herein is intended to encompass such instructions stored in storage medium such as RAM, a hard disk, optical disk, or so forth, and is also intended to encompass so-called "firmware" that is software stored on a ROM or so forth. Such software may be organized in various ways, and may include software components organized as libraries, Internet-based programs stored on a remote server or so forth, source code, interpretive code, object code, directly executable code, and so forth. It is contemplated that the software may invoke system-level code or calls to other software residing on a server or other location to perform certain functions. Operations of the AMHS/OHT controller 108 will be better understood in conjunction with the exemplary methods set forth in FIGS. 5 and 6.

Figure 5:
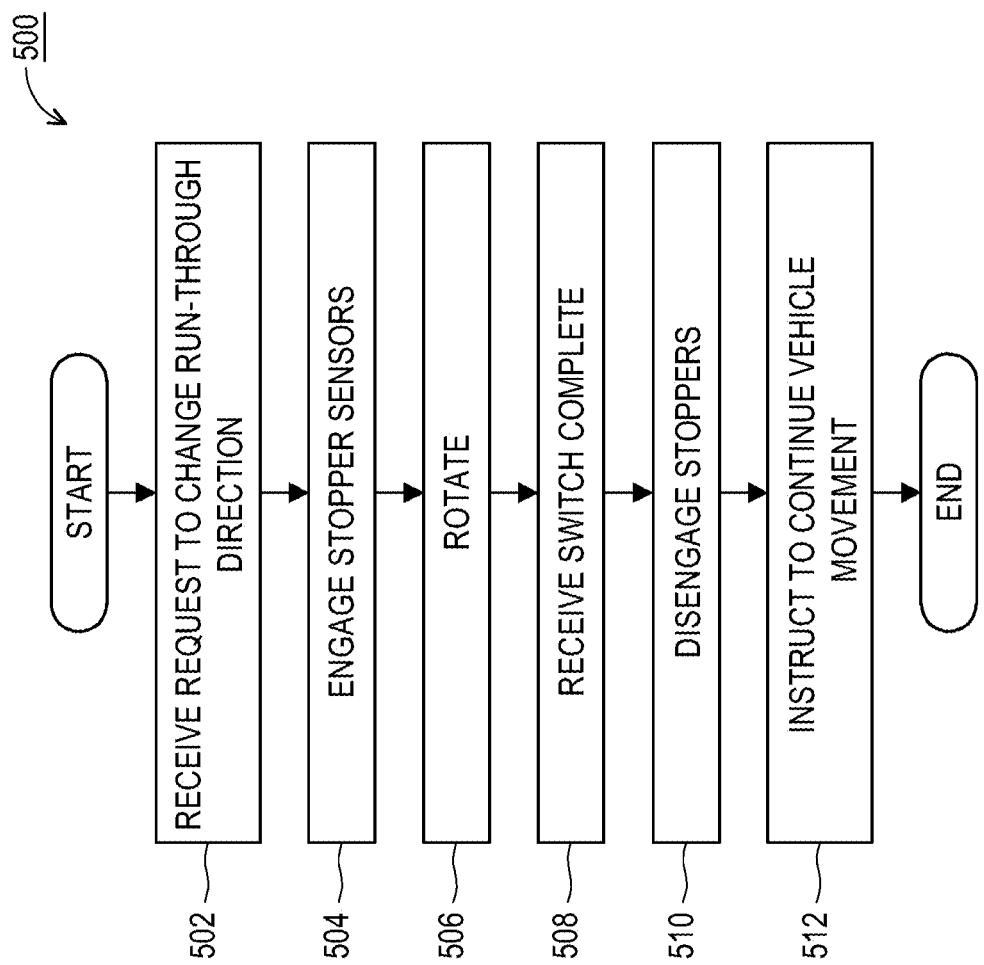
FIG. 5 depicts a flowchart illustrating a method for AMHS/OHT rail control in accordance with some embodiments of the subject application.

Turning now to FIG. 5, there is shown an exemplary method 500 for AMHS/OHT rail control in accordance with one embodiment of the subject application. The method 500 begins at 502, whereupon the AMHS/OHT controller 108 receives a request to change the run-through direction of the turntable 106 from the first run-through direction to the second run-through direction. In some embodiments, this request is received by the traffic component 434 in accordance with current traffic conditions on the OHT 102. In other embodiments, the command is received in accordance with a preplanned switch in traffic. In still other embodiments, the request is received from an external source, e.g., a traffic control center (not shown) in communication with the AMHS/OHT controller 108. In such an embodiment, the request may be automated or manually input, i.e. an operator monitoring the AMHS system 100 may request that the run-through direction of the turntable 106 be changed.

At 504, the traffic component 434, in conjunction with the sensor component 426, engage the stopper sensors 202 in proximity to the turntable 106 to halt traffic, i.e. movement of vehicles 112, through the turntable 106. In accordance with one embodiment, the vehicles 112 may receive commands from the AMHS/OHT controller 108 instructing the vehicles 112 to apply brakes to stop movement prior to or at the position of the stopper sensors 202. In accordance with some embodiments contemplated herein, prior to engaging the stopper sensors 202, all vehicles 112 traveling in the first run-through direction are purged, i.e., they are allowed to complete travel across the turntable 106 prior to engaging the stoppers 202. The turntable 106 then begins rotation at 506 in accordance with a desired setting, i.e. clockwise or counterclockwise, as well as the degree of rotation, thereby moving the turntable 106 from the first run-through position (FIG. 2A) to the second run-through position (FIG. 2B).

At 508, the orientation component 428 receives an indication that that the switch from the first run-through direction to the second run-through direction has been completed. In some embodiments, this indication may be received from the turntable 106 directly, via the sensor component 426 in conjunction with an output of the alignment sensors 200, or any suitable combination thereof. The traffic component 434 in cooperation with the sensor component 426 then signals the stopper sensors 202 at 510 to disengage. Thereafter, at 512, the vehicles 112 that were stopped in proximity to the turntable 106 are instructed to continue movement, with direct passage in the second run-through direction now enabled.

Figure 6:
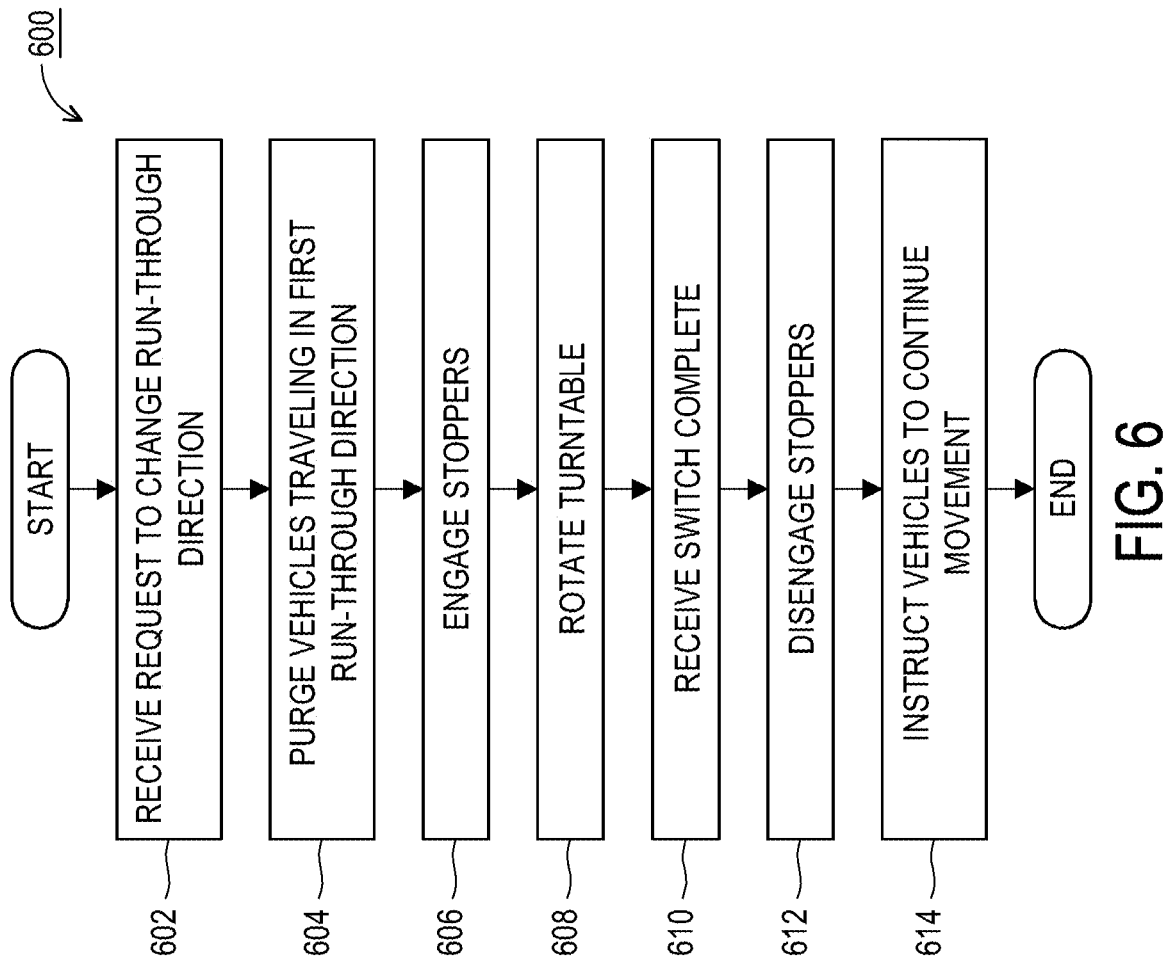
FIG. 6 depicts a flowchart illustrating a method for AMHS/OHT rail control in accordance with some embodiments of the subject application.

Referring now to FIG. 6, there is shown another embodiment of a method 600 for AMHS rail control in accordance with the subject application. The method 600 begins at 602, whereupon the AMHS/OHT controller 108 receives a request to change the run-through direction of the turntable 106 from the first run-through direction to the second run-through direction. In some embodiments, this request is received by the traffic component 434 in accordance with current traffic conditions on the OHT 102. In other embodiments, the command is received in accordance with a preplanned switch in traffic. In still other embodiments, the request is received from an external source, e.g., a traffic control center (not shown) in communication with the AMHS/OHT controller 108. In such an embodiment, the request may be automated or manually input, i.e. an operator monitoring the AMHS system 100 may request that the run-through direction of the turntable 106 be changed.

At 604, any vehicles 112 moving in the first run-through direction are purged, i.e. the vehicles 112 transit the turntable 106. After purging at 604, operations proceed to 606, whereupon the traffic component 434, in conjunction with the sensor component 426, engage the stopper sensors 202 in proximity to the turntable 106 to halt traffic, i.e. movement of vehicles 112, through the turntable 106. In accordance with one embodiment, the vehicles 112 may receive commands from the AMHS/OHT controller 108 instructing the vehicles 112 to apply brakes to stop movement prior to or at the position of the stopper sensors 202. The turntable 106 then begins rotation at 608 in accordance with a desired setting, i.e. clockwise or counterclockwise, as well as the degree of rotation, thereby moving the turntable 106 from the first run-through position (FIG. 2A) to the second run-through position (FIG. 2B).

At 610, the orientation component 428 receives an indication that that the switch from the first run-through direction to the second run-through direction has been completed. According to one embodiment, the orientation component 428, functioning as a safety interlock, confirms via the alignment sensors 200 that the switch/rotation from the first run-through direction to the second run-through direction has been completed. In some embodiments, the turntable 106 returns a switch complete signal to the AMHS/OHT controller 108 indicating that the turntable 106 has successfully changed orientation to the second run-through direction. Thereafter, at 612, the traffic component 434 in cooperation with the sensor component 426 communicates a disable signal to the stopper sensors 202 to disengage. At 614, the vehicles 112 that were stopped in proximity to the turntable 106 are instructed to continue movement, with direct passage in the second run-through direction now enabled.

Figure 7:
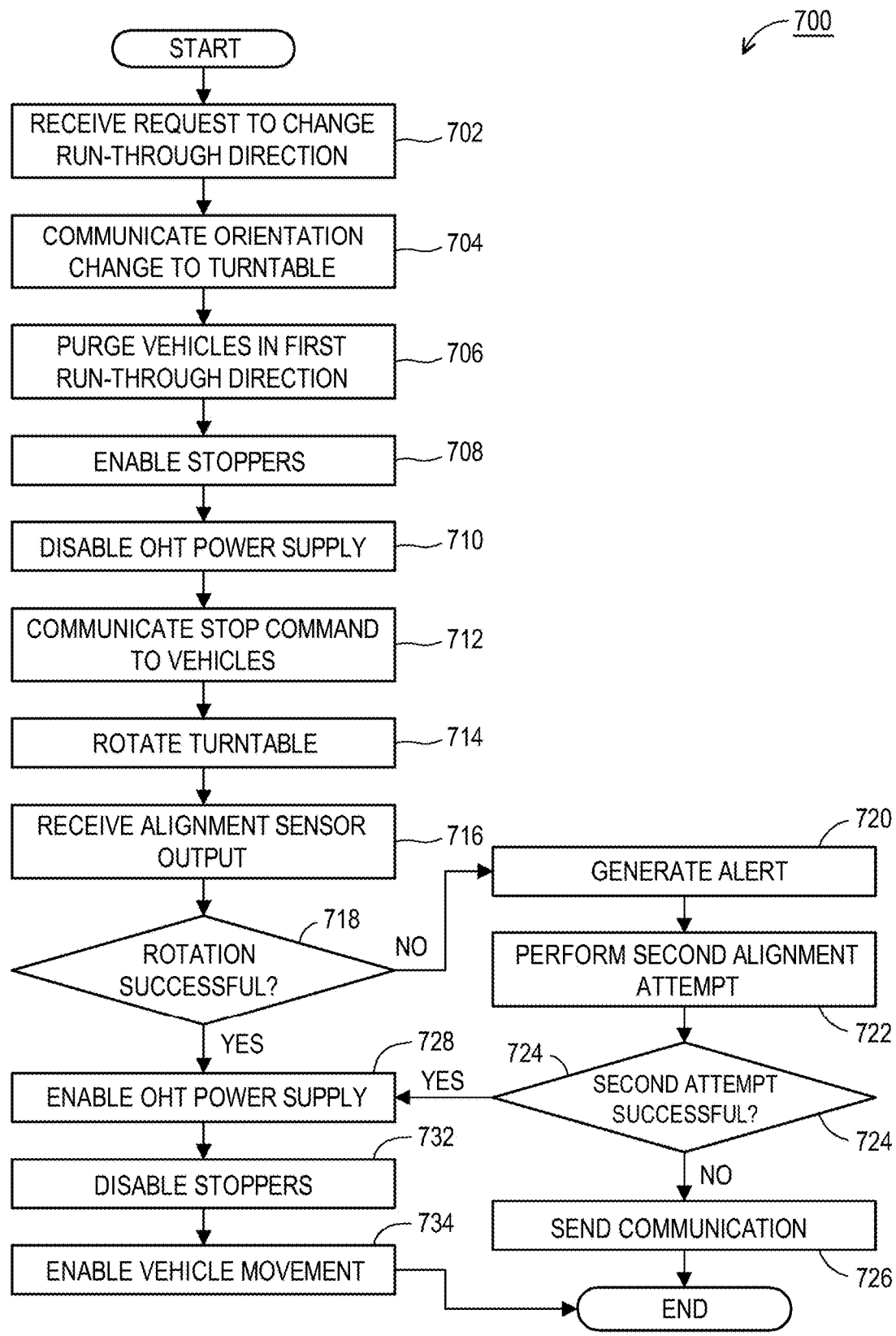
FIG. 7 depicts a flowchart illustrating a method for AMHS/OHT rail control in accordance with some embodiments of the subject application.

Referring now to FIG. 7, there is shown yet another embodiment of a method 700 for AMHS rail control in accordance with the subject application. The method 700 begins at 702, whereupon the AMHS/OHT controller 108 receives a request to change the run-through direction of the turntable 106 from the first run-through direction to the second run-through direction. In this embodiment, the turntable 106 is equipped with a power supply for the OHT 102, a power supply switch, a plurality of safety interlocks (alignment sensors 200), and a plurality of stoppers (stopper sensors 202). The AMHS/OHT controller 108 then signals, at 704, the turntable 106 to change orientation from the first run-through direction to the second run-through direction. At 706, any vehicles 112 moving in the first run-through direction are purged, i.e. complete transit across the turntable 106. At 708, stoppers 202 are enabled to prevent any vehicle movement across the turntable 106. At 710, the power supply for the OHT 102 is disabled. According to such an embodiment, the power for the vehicles 112 that have been stopped on the OHT 102 are disabled via the AMHS/OHT controller 108. Any vehicles 112 approaching the turntable 106 on the OHT 102 are thereby stopped from moving at 712 via a command communicated to the vehicles 112 by the controller 108. At 714, the turntable 106 begins rotating from the first run-through direction to the second run-through direction.

At 716, the AMHS/OHT controller 108 receives an output from the alignment sensors 200 (i.e. the safety interlocks) regarding positioning of the turntable 106 relative to the rails 104 of the OHT 102. A determination is then made at 718 whether the turntable 106 has successfully rotated and aligned the turntable rails 114 with the rails 104 of the OHT 102 in the second run-through direction. Upon a negative determination at 718, operations proceed to 720, whereupon an alert is generated indicating a failure to align. Thereafter, at 722, a second attempt to rotate into position by the turntable 106 is performed in accordance with an output of the alignment sensor 200. A determination is then made at 724 whether the second attempt is successful. Upon a negative determination at 724, operations proceed to 726, whereupon a signal is communicated to a technician or other suitable personnel associated with the AMHS system 100.

Upon a positive determination at 724 or at 718 that that the rotation and alignment is confirmed, operations proceed to 728, whereupon the OHT power supply is enabled. At 730, the stopper sensors 202 are disabled via the AMHS/OHT controller 108. Thereafter, vehicles 112 that were previously halted prior to transiting the turntable 106 are enabled to move in the second run-through direction across the turntable 106 at 732.

In accordance with a first embodiment, there is provided a method for AMHS rail control that includes receiving, at a controller including a processor in communication with memory, a request to rotate a turntable on an OHT of the AMHS from a first run-through direction to a second run-through direction. The method also includes engaging at least one stopper sensor located in proximity to the turntable, and rotating the turntable from the first run-through direction to the second run-through direction. Further, the method includes disengaging the at least one stopper in response to a rotation of the turntable from the first run-through direction to the second run-through direction.

In accordance with a second embodiment, there is provided a rail management system that includes an overhead transport ("OHT") system of an associated automated material handing system ("AMHS") that has a plurality of fixed rails in a semiconductor manufacturing facility and at least one vehicle configured to travel along the plurality of fixed rails. The system also includes a controller having a processor in communication with memory, the controller in electronic communication with the OHT system. The rail management system also includes a turntable having a set of fixed rails positioned on the turntable, which is located on a portion of the OHT. The memory in communication with the processor is configured to store instructions which are executed by the processor causing the processor to receive a request to rotate the turntable from a first run-through direction to a second run-through direction, and engage at least one stopper sensor proximate to the turntable. The memory further stores instructions executed by the processor to rotate the turntable from the first run-through direction to the second run-through direction, and to disengage the at least one stopper responsive to a rotation of the turntable from the first run-through direction to the second run-through direction.

In accordance with third embodiment, there is provided a computer implemented method for vehicle rail traffic management on an automated material handling system comprising an overhead transportation ("OHT") system. The method includes receiving a request to rotate a turntable on the OHT of the AMHS from a first run-through direction to a second run-through direction. The method also includes purging at least one vehicle traveling in the first run-through direction across the turntable, and engaging at least one stopper sensor proximate to the turntable. Additionally, the method includes communicating to each of a plurality of vehicles traveling towards the turntable to halt, and rotating the turntable from the first run-through direction to the second run-through direction. Further, the method includes receiving a switch complete signal from the turntable confirming rotation from the first run-through direction to the second run-through direction in accordance with an output of a plurality of alignment sensors. The method also includes disengaging the at least one stopper responsive to a rotation of the turntable from the first run-through direction to the second run-through direction.

Some portions of the detailed description herein are presented in terms of algorithms and symbolic representations of operations on data bits performed by conventional computer components, including a central processing unit (CPU), memory storage devices for the CPU, and connected display devices. These algorithmic descriptions and representations are the means used by those skilled in the data processing arts to most effectively convey the substance of their work to others skilled in the art. An algorithm is generally perceived as a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be understood, however, that all of these and similar terms are to be associated with the appropriate physical quantities and are merely convenient labels applied to these quantities. Unless specifically stated otherwise, as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The exemplary embodiment also relates to an apparatus for performing the operations discussed herein. This apparatus may be specially constructed for the required purposes, or it may comprise a general-purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general-purpose systems may be used with programs in accordance with the teachings herein, or it may prove convenient to construct more specialized apparatus to perform the methods described herein. The structure for a variety of these systems is apparent from the description above. In addition, the exemplary embodiment is not described with reference to any particular programming language. It will be appreciated that a variety of programming languages may be used to implement the teachings of the exemplary embodiment as described herein.

A machine-readable medium includes any mechanism for storing or transmitting information in a form readable by a machine (e.g., a computer). For instance, a machine-readable medium includes read only memory ("ROM"); random access memory ("RAM"); magnetic disk storage media; optical storage media; flash memory devices; and electrical, optical, acoustical or other form of propagated signals (e.g., carrier waves, infrared signals, digital signals, etc.), just to mention a few examples.

The methods illustrated throughout the specification, may be implemented in a computer program product that may be executed on a computer. The computer program product may comprise a non-transitory computer-readable recording medium on which a control program is recorded, such as a disk, hard drive, or the like. Common forms of non-transitory computer-readable media include, for example, floppy disks, flexible disks, hard disks, magnetic tape, or any other magnetic storage medium, CD-ROM, DVD, or any other optical medium, a RAM, a PROM, an EPROM, a FLASH-EPROM, or other memory chip or cartridge, or any other tangible medium from which a computer can read and use.

Alternatively, the method may be implemented in transitory media, such as a transmittable carrier wave in which the control program is embodied as a data signal using transmission media, such as acoustic or light waves, such as those generated during radio wave and infrared data communications, and the like.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for automatic material handling system ("AMHS") rail control of a semiconductor wafer transport system, comprising:

receiving, at a controller including a processor in communication with memory, a request to rotate a turntable on an overhead transport ("OHT") of the AMHS from a first run-through direction to a second run-through direction, the turntable having a set of parallel rails providing a rotatable intersection of a first OHT fixed rail section aligned with the first run-through direction with the turntable at a first position and a second OHT fixed rail section aligned with the second run-through direction with the turntable at a second position;

prior to rotating the turntable, the controller purging the first OHT fixed rail section of one or more first wafer carrier vehicles moving on the first OHT fixed rail section to allow the one or more first wafer carrier vehicles to complete travel across the turntable;

prior to rotating the turntable and after purging the first OHT fixed rail section, the controller detecting and stopping subsequent first wafer carriers traveling on the first OHT fixed rail section by activating at least one first stopper sensor positioned on the first OHT fixed rail section, the first stopper sensor located proximate to the turntable and the first wafer carrier vehicle stopping prior to transiting the turntable;

prior to rotating the turntable the controller detecting and stopping a second wafer carrier vehicle moving on the second OHT fixed rail section by activating at least one second stopper sensor positioned on the second OHT fixed rail section, the second stopper sensor located proximate to the turntable and the second wafer carrier vehicle stopping prior to transiting the turntable;

rotating the turntable from the first run-through direction to the second run-through direction while receiving an alignment signal from at least one alignment sensor pair positioned on the turntable and positioned proximate to the turntable on the second OHT fixed rail section, the alignment signal representative of a relative alignment of the turntable with respect to the second OHT fixed rail section; and in response to a completed rotation of the turntable from the first run-through direction to the second run-through direction indicated by the alignment signal, the controller deactivating the oner or more second stopper sensors and instructing the stopped second wafer carrier vehicle to continue movement along one of the first fixed rail section and the second OHT fixed rail section to transit the turntable along the second run-through direction.

2. The method of claim 1, further comprising the controller detecting and stopping two or more first wafer carrier vehicles on the first OHT fixed rail section proximate to the turntable in response to the detection of the two or more first wafer carrier vehicles using two or more second stopper sensors.

3. The method of claim 1, further comprising receiving, from at least two alignment sensor pairs, the alignment signal relative to alignment of the turntable with respect to the second OHT fixed rail section.

4. The method of claim 1, wherein the step of the controller detecting and stopping a first wafer carrier vehicle is in response to the received alignment sensor signal.

5. The method of claim 1, wherein the step of the controller detecting and stopping one or more first wafer carrier vehicles further comprises sending a command to the one or more first wafer carrier vehicles to stop movement of the first wafer carrier vehicles.

6. The method of claim 1, further comprising receiving a switch complete signal from the turntable, wherein the step of the controller detecting and stopping subsequent first wafer carrier vehicles is in response to the received switch complete signal.

7. The method of claim 1, further comprising purging two or more first wafer carrier vehicles traveling in the first run-through direction on the first OHT fixed rail section prior to the controller detecting and stopping the subsequent first OHT wafer carrier vehicles.

8. The method of claim 7, wherein stopping the subsequent first OHT wafer carrier vehicles further comprises disabling a power supply associated with the subsequent first OHT wafer carrier vehicles.

9. The method of claim 8, further comprising enabling the power supply associated with the subsequent first OHT wafer carrier vehicles in response to an output of the at least one alignment sensor pair.

10. The method of claim 1, further comprising generating an alert in response to an output of the at least one alignment sensor pair indicative of a misalignment of the turntable.

11. A semiconductor wafer transport system rail management system comprising:
an overhead transport ("OHT") system of an associated automated material handling system ("AMHS") comprising a plurality of fixed rails and at least one wafer carrier vehicle configured to travel along the plurality of fixed rails;
a controller comprising a processor in communication with memory, the controller in electronic communication with the overhead transport system;
a turntable having a set of parallel fixed rails positioned thereon, the turntable located on a portion of the OHT and providing a rotatable intersection of a first OHT fixed rail section aligned with a first run-through direction with the turntable at a first position and a second OHT fixed rail section aligned with a first run-through direction with the turntable at a second position;
wherein the memory further stores instructions that are executed by the processor causing the processor to:
receive a request to rotate the turntable from the first run-through direction to the second run-through direction,
prior to rotating the turntable, purge the first OHT fixed rail section of one or more first wafer carrier vehicles moving on the first OHT fixed rail section to allow the one or more first wafer carrier vehicles to complete travel across the turntable;
prior to rotating the turntable, and after purging the first OHT fixed rail section, detect and stop subsequent first wafer carriers traveling on the first OHT fixed rail section by activating at least one first stopper sensor positioned on the first OHT fixed rail section, the first stopper sensor located proximate to the turntable and the first wafer carrier vehicle stopping prior to transiting the turntable;
prior to rotating the turntable, detect and stop a second wafer carrier vehicle moving on the second fixed rail section by activating at least one second stopper sensor positioned on the second OHT fixed rail section, the second stopper sensor located proximate to the turntable and the second wafer carrier vehicle stopping prior to transiting the turntable;
rotate the turntable from the first run-through direction to the second run-through direction while receiving an alignment signal from at least one alignment sensor pair positioned on the turntable and positioned proximate to the turntable on the second OHT fixed rail section, the alignment signal representative of a relative alignment of the turntable with respect to the second OHT fixed rail section; and
in response to a completed rotation of the turntable from the first run-through direction to the second run-through direction indicated by the alignment signal, deactivating the oner or more second stopper sensors and instructing the stopped second wafer carrier vehicle to continue movement along the second OHT fixed rail section to transit the turntable along the second run-through direction.

12. The rail management system of claim 11, further comprising at least two alignment sensor pairs positioned proximate to the turntable and configured to generate the alignment signal relative to alignment of the turntable with respect to the second OHT fixed rail section.

13. The rail management system of claim 11, wherein the memory further stores instructions for detecting and stopping two or more first wafer carrier vehicles on the first OHT fixed rail section proximate to the turntable in response to the detection of the two or more first wafer carrier vehicles using two or more second stopper sensors.

14. The rail management system of claim 11, wherein the first OHT fixed rail section is perpendicular to the second OHT fixed rail section.

15. The rail management system of claim 14, wherein the first run-through direction corresponds to a main rail section including the first OHT fixed rail section, and wherein the set of parallel rails on the turntable are aligned with the first OHT fixed rail section of the main rail section prior to rotating the turntable.

16. The rail management system of claim 15, wherein the turntable is positioned for the second run-through direction and the set of parallel fixed rails on the turntable are aligned with the second OHT fixed rail section.

17. The rail management system of claim 11, wherein the turntable is configured to rotate from the first run-through direction to the second run-through direction, and from the second run-through direction to a third run-through direction.

18. A computer implemented method for wafer carrier vehicle rail traffic management on an automated material handling system ("AMHS") comprising an overhead transportation ("OHT") system, the method comprising:
receiving a request to rotate a turntable on the OHT of the AMHS from a first run-through direction to a second run-through direction, the turntable having a set of parallel fixed rails positioned thereon, the turntable located on a portion of the OHT, the turntable providing a rotatable intersection of a first OHT fixed rail section aligned with the first run-through direction with the turntable at a first position and a second OHT fixed rail section aligned with the first run-through direction with the turntable at a second position;

prior to rotating the turntable, the controller purging the first OHT fixed rail section of one or more first wafer carrier vehicles moving on the first OHT fixed rail section to allow the one or more first wafer carrier vehicles to complete travel across the turntable;

prior to rotating the turntable and after purging the first OHT fixed rail section, the controller detecting and stopping subsequent first wafer carriers traveling on the first OHT fixed rail section by activating at least one first stopper sensor positioned on the first OHT fixed rail section, the first stopper sensor located proximate to the turntable and the first wafer carrier vehicle stopping prior to transiting the turntable;

prior to rotating the turntable, detecting and stopping a second wafer carrier vehicle moving on the second OHT fixed rail section by activating at least one second stopper sensor positioned on the second OHT fixed rail section, the second stopper sensor located proximate to the turntable and the second wafer carrier vehicle stopping prior to transiting the turntable;

rotating the turntable from the first run-through direction to the second run-through direction while receiving an alignment signal from at least one alignment sensor pair positioned on the turntable and positioned proximate to the turntable on the second OHT fixed rail section, the alignment signal representative of a relative alignment of the turntable with respect to the second OHT fixed rail section;

receiving a switch complete signal from the turntable confirming rotation from the first run-through direction to the second run-through direction in accordance with an output of the at least one alignment sensor pair; and in response to a completed rotation of the turntable from the first run-through direction to the second run-through direction, i deactivating the oner or more second stopper sensors and instructing the stopped second wafer carrier vehicle to continue movement along the second OHT fixed rail section to transit the turntable along the second run-through direction.

19. The computer-implemented method of claim 18, wherein detecting and stopping the subsequent first OHT wafer carrier vehicles further comprises disabling a power supply associated with the subsequent first OHT wafer carrier vehicles.

20. The computer-implemented method of claim 18, further comprising enabling a power supply associated with the subsequent first OHT wafer carrier vehicles in response to an output of the at least one alignment sensor pairs.

* * * * *